(12) United States Patent
Huang

(10) Patent No.: US 6,688,969 B2
(45) Date of Patent: Feb. 10, 2004

(54) METHOD FOR PLANARIZING A DIELECTRIC LAYER OF A FLASH MEMORY DEVICE

(75) Inventor: Chi-Tung Huang, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 10/165,655

(22) Filed: Jun. 7, 2002

(65) Prior Publication Data

US 2003/0194952 A1 Oct. 16, 2003

(30) Foreign Application Priority Data

Apr. 12, 2002 (TW) .................................... 91107422 A

(51) Int. Cl.$^7$ ................................................ B24B 1/00
(52) U.S. Cl. ........................... 451/41; 451/60; 438/257
(58) Field of Search .................. 451/41, 921, 526–529, 451/173, 60, 548, 550; 438/692–693

(56) References Cited

U.S. PATENT DOCUMENTS

| 5,441,598 A | * | 8/1995 | Yu et al. ...................... 438/692 |
| 5,692,950 A | * | 12/1997 | Rutherford et al. .......... 451/552 |
| 6,039,633 A | * | 3/2000 | Chopra ........................ 451/41 |
| 6,354,919 B2 | * | 3/2002 | Chopra ........................ 451/57 |
| 6,431,960 B1 | * | 8/2002 | Walker et al. ................ 451/41 |
| 6,514,821 B1 | * | 2/2003 | Huang .......................... 438/257 |

* cited by examiner

Primary Examiner—George Nguyen
(74) Attorney, Agent, or Firm—J.C. Patents

(57) ABSTRACT

A method for planarizing the dielectric layer of a flash memory device, wherein the method is applied on substrate of a flash memory device having a plurality of gate structures formed thereon and a protective layer is formed on the gate structures. A dielectric layer is formed on the substrate, filling the space between the gate structures and covering the protective layer. Using the protective layer as a polishing endpoint layer, a fixed base and a polishing slurry that does not contain metal ions are used to chemical mechanically polish and to planarize the dielectric layer. The fixed base includes a base and evenly distributed polishing abrasives fixed onto the base.

18 Claims, 5 Drawing Sheets

METHOD FOR PLANARIZING A DIELECTRIC LAYER OF A FLASH MEMORY DEVICE

CROSS-REFERENCE TO RELATED APPLICATION

This application claims the priority benefit of Taiwan application serial no. 91107422, filed Apr. 12, 2002.

BACKGROUND OF THE INVENTION

1. Field of Invention

This invention relates to a method for planarizing a semiconductor device. More particularly, the present invention relates to a method for planarizing the dielectric layer of a flash memory device.

2. Description of Related Art

Chemical-mechanical polishing (CMP) is one of the techniques used to provide a global planarization in the manufacturing of Ultra Large Scale Integrated-Circuits. The essence of a CMP process includes a rotating polishing platen and a wafer holder, which can both exert a force on the wafer and rotate the wafer independent of the rotation of the platen. A chemical reagent also accompanies the polishing such that the topography is removed and a good uniformity across the entire surface is maintained.

The chemical reagent used in chemical mechanical polishing is known as polishing slurry. The polishing slurry consists of colloidal silica or dispersed alumina in an alkaline potassium hydroxide (KOH) or ammonium hydroxide ($NH_4OH$) solution. The basic polishing mechanism for polishing a material on a wafer includes chemically altering the material to be polished and removing the chemically altered material based on the mechanical abrasion of the slurry.

FIGS. 1A through 1F are schematic, cross-sectional views, illustrating the successive steps in polishing the dielectric layer of a flash memory device according to the prior art.

As shown in FIG. 1A, polysilicon gate structures 102 are formed on a substrate 100, wherein the polysilicon gate structures comprise a silicon nitride layer formed thereon.

Referring to FIG. 1B, a dielectric layer 106, for example, a silicon nitride layer, is formed on the substrate 100, filling the space between the gate structures 102 and covering the silicon nitride layer 104.

Thereafter, as shown in FIG. 1C, an alignment key oxide dipping (AOD) process is conducted to remove a majority of the dielectric layer 106 on the gate structures 102. An oxide dip is further conducted to remove a portion of the dielectric layer 106 to expose a corner 108 of the silicon nitride layer 104. The dielectric layer 106 is thereby resulted in the dielectric layer 106*a* that fills the space between the polysilicon gate structures 102 and the dielectric layer 106*b* that covers the silicon nitride layer 104. Subsequently, a silicon nitride layer 110 is deposited on the substrate 100.

Continuing to FIG. 1D, chemical mechanical polishing is conducted to planarize the silicon nitride layer 110 and the dielectric layer 106*b*. An oxide dip is further used to remove the metal ions and to increase the reliability of the device, wherein the metal ions are resulted from the potassium hydroxide solution used in chemical mechanical polishing. The dielectric layer 106*b* removed by the oxide dip is about 100 angstroms thick.

As shown in FIG. 1E, the dielectric layer 106*b* is removed.

As shown in FIG. 1F, the silicon nitride layers 110, 104 are removed.

In the aforementioned conventional technique, an AOD process is conducted before the planarization process. An oxide dip is used to remove a part of the dielectric layer 106 to expose a corner of the silicon nitride layer 104. A silicon nitride layer 110 is then deposited on the dielectric layer 106*a* & 106*b*, followed by performing the CMP process. The conventional approach is thus complicated and time consuming.

SUMMARY OF THE INVENTION

The invention provides a method to planarize the dielectric layer of a flash memory device, wherein the number of the processing steps are reduced to simplify the overall manufacturing process. The penetration of the metal ions into the substrate is prevented, wherein the metal ions are contained in the slurry used in the convention CMP approach. As a result, a reduction of the reliability of the device is also prevented The present invention provides a method for planarizing the dielectric layer of a flash memory device, wherein this method includes forming a plurality of gate structures on a flash memory substrate. The gate structures further comprise a protective layer formed thereon. A dielectric layer is further formed on the flash memory substrate. The dielectric layer fills the space between the gate structures and covers the protective layer. Thereafter, using the protective layer as the polishing endpoint layer, chemical mechanical polishing is then conducted using a fixed polishing pad and a slurry that does not contain metal ions to planarize the dielectric layer. The fixed polishing pad includes a base and polishing abrasives, which are fixed and evenly distributed on the base.

According to the present invention, the fixed polishing abrasive technique is applied to perform the planarization process. As a result, many processing steps in the conventional practice can be omitted to simplify the entire manufacturing process and to reduce the manufacturing cost. Furthermore, since metal ions are absent in the slurry used as the polishing agent in the present invention, the reliability of the device increases.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 2A through 2E are schematic, cross-sectional views, illustrating successive steps for planarizing the dielectric layer of a flash memory device according to a preferred embodiment of the present invention. Furthermore, the present invention is applicable to the Mask Read-Only Memory (Mask ROM) or the Electrically-Erasable-Programmable-Read-Only Memory ($E^2$PROM).

Figure 1A:
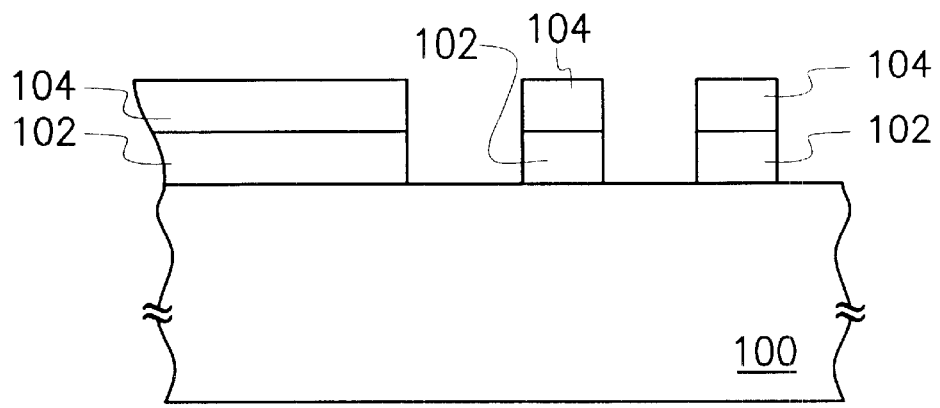
FIGS. 1A through 1F are schematic, cross-sectional views, illustrating the successive steps in polishing the dielectric layer of a flash memory device according to the prior art.
Figure 1B:
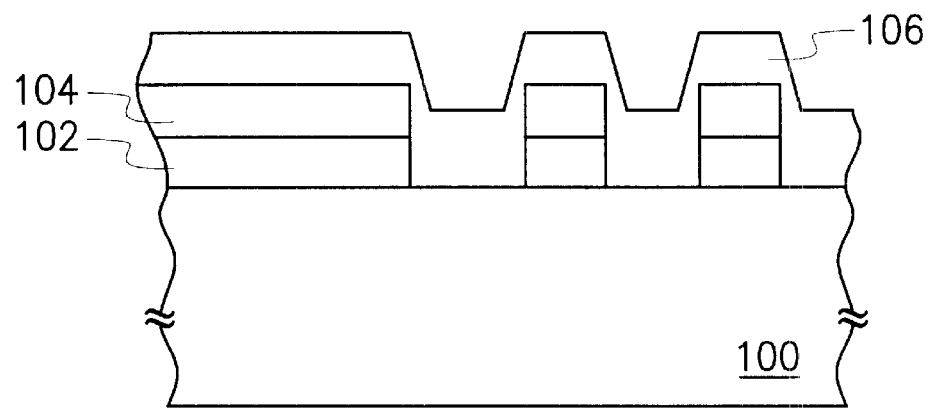
Figure 1C:
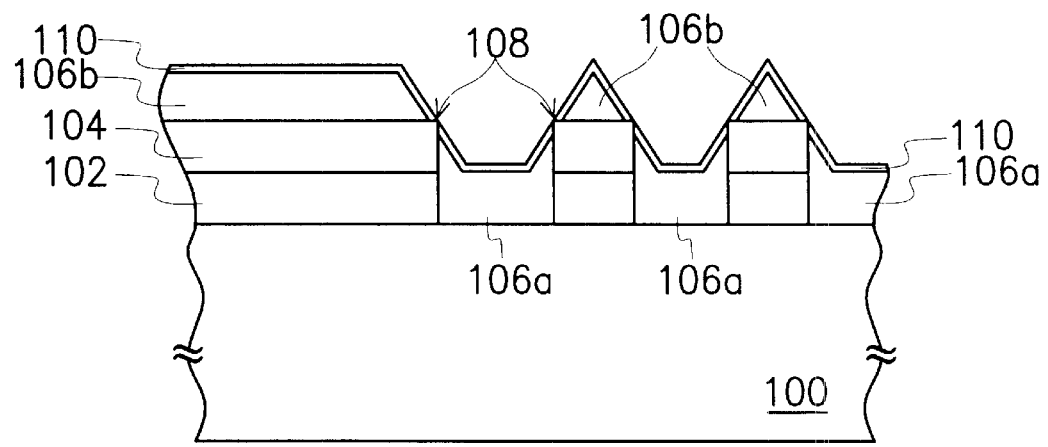
Figure 1D:
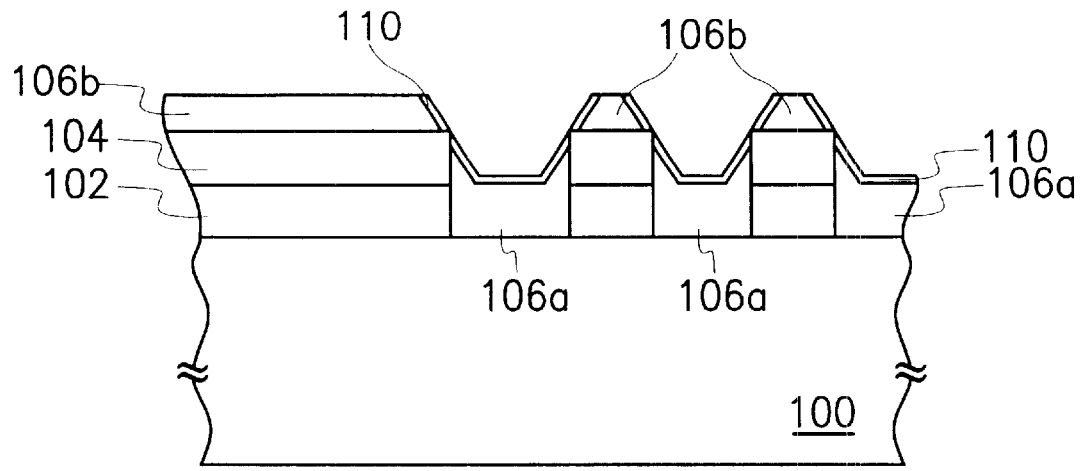
Figure 1E:
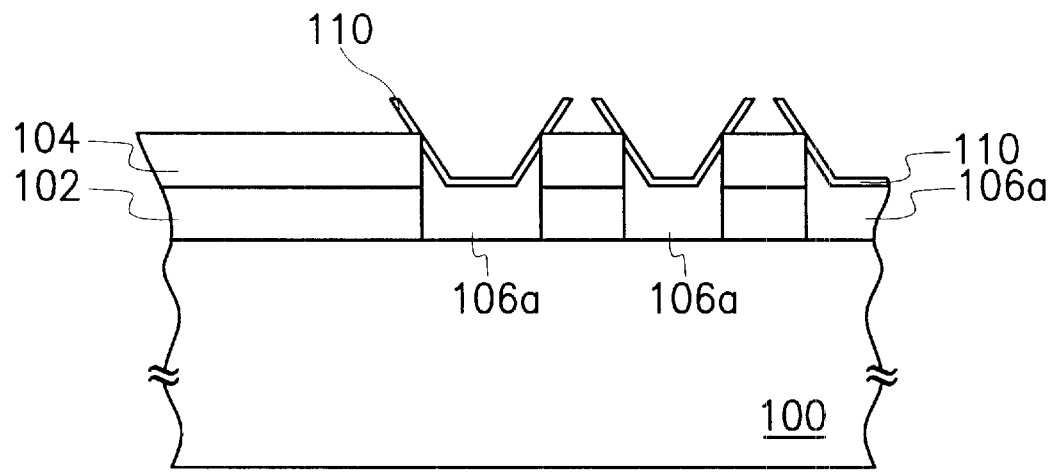
Figure 1F:
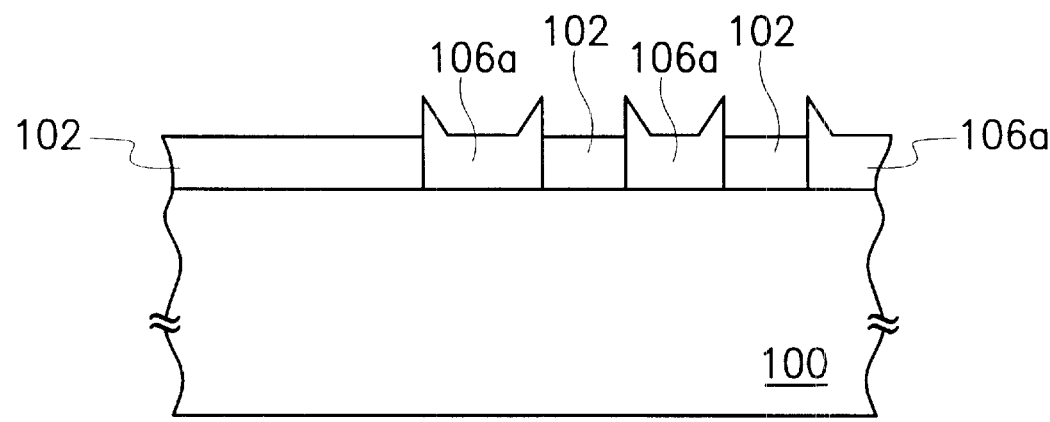
Figure 2A:
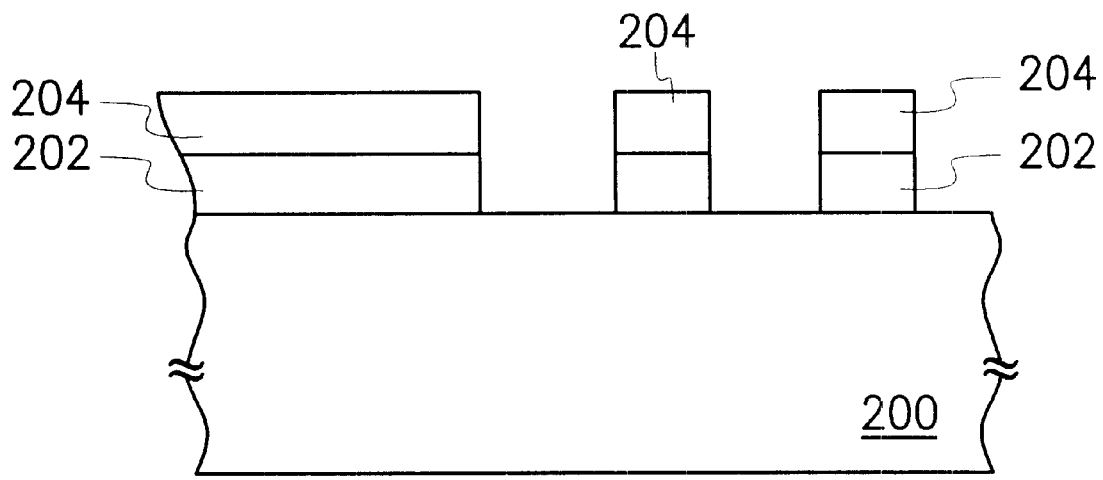
FIGS. 2A through 2E are schematic, cross-sectional views, illustrating the successive steps for planarizing the dielectric layer of a flash memory device according to a preferred embodiment of the present invention.

Referring to FIG. 2A, a substrate 200, wherein gate structures 202 already formed thereon, is provided. A protective layer 204 is formed on the gate structures 202. The gate structure 202 of a flash memory is formed with, for example, polysilicon.

Figure 2B:
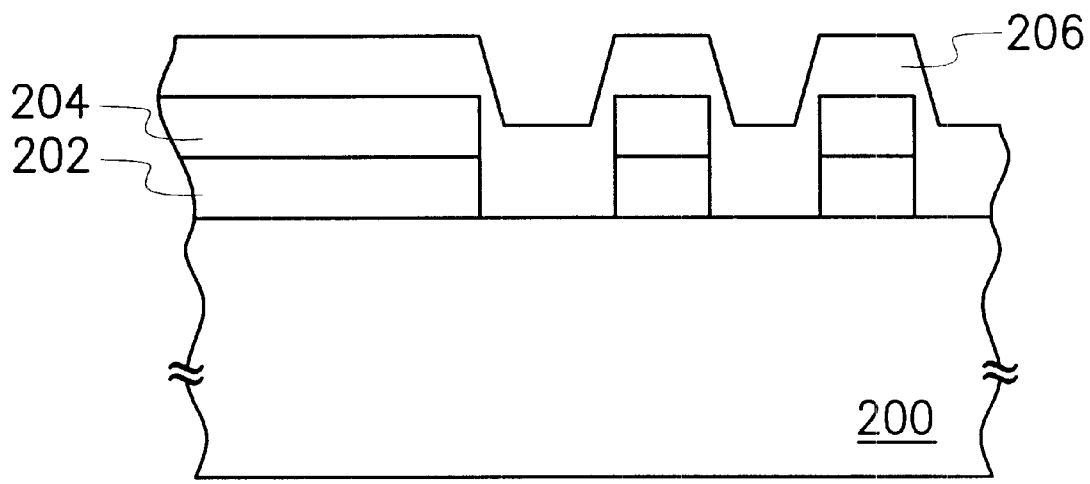

As shown in FIG. 2B, a dielectric layer 206 with good step coverage and gap filling properties is formed on the substrate 200, filling the space between the gate structures 202 and covering the protective layer 204. The dielectric layer 206 is, for example, a high density plasma (HDP) oxide layer, a plasma enhanced (PE) oxide layer, a tetra-ethylorthosilicate (TEOS) oxide layer or a silicon oxynitride (SiON) layer.

Figure 2C:
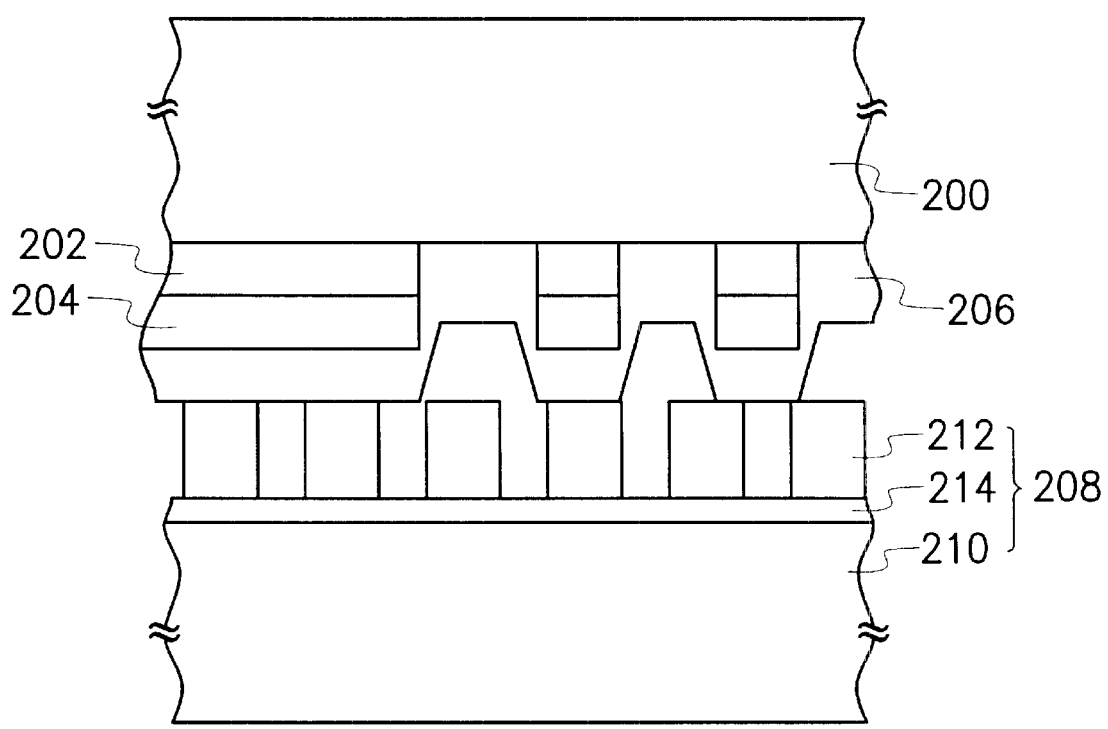
Figure 2D:
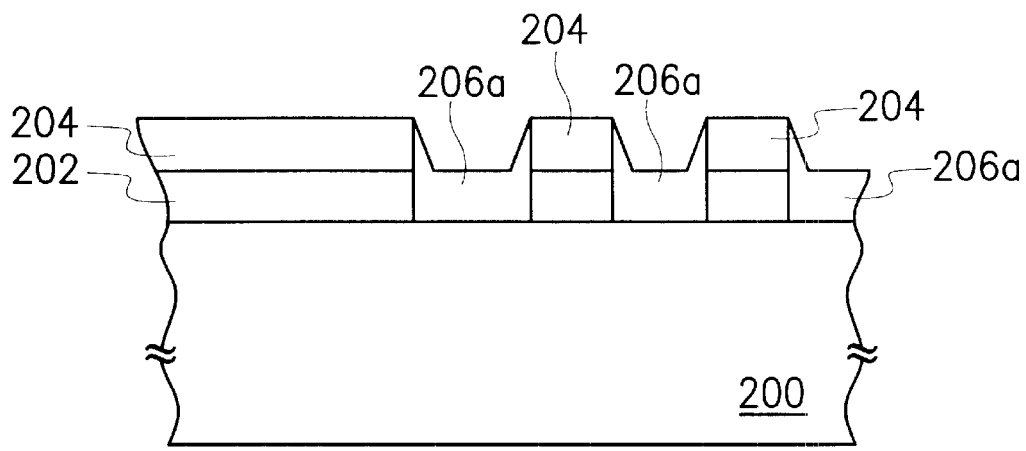

Continuing to FIG. 2C, using the protective layer 204 as a polishing endpoint layer, chemical mechanical polishing is conducted on the dielectric layer 206. The chemical mechanical polishing process employs a fixed abrasive pad 208, wherein the fixed abrasive pad 208 comprises a base 210 and polishing abrasives 212, which are fixed and evenly distributed on the base 210. Furthermore, resin type of adhesives 214 are used to fix the polishing abrasives 212. The polishing abrasives 212 are, for example, column shapes of about 40 to 45 microns high and about 150 to 250 microns in diameter. When a fixed abrasive pad 208 is applied, the slurry used for polishing, for example, deionized water, does not contain any metal ions. As a result, the conventional approach of using potassium hydroxide (KOH) as the polishing slurry is avoided. The penetration of metal ions into the substrate 200 and the infliction of damages to the device are thus prevented. Moreover, using the fixed abrasive pad 208 to perform the planarization process, the protruding portion on the dielectric layer 206 is first in contact with the polishing abrasives 212 on the base 210. The protruding portion on the dielectric layer 206, therefore, is removed first. The fixed abrasive pad 208 is highly selective when it is used to planarize a layer having topography of significant height differences. FIG. 2D illustrates the dielectric layer 206a after being planarized according the present invention.

Figure 2E:
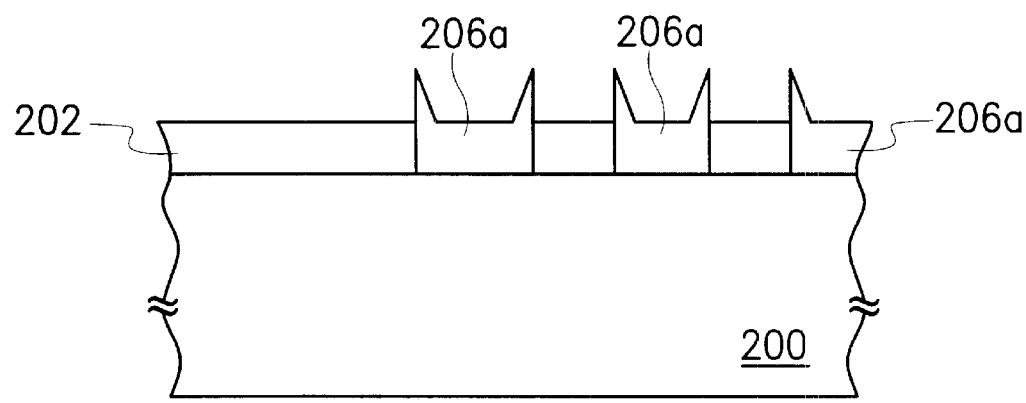

As shown in FIG. 2E, the protective layer 204 on the gate structures 202 is removed.

The present invention employs the fixed polishing pad to planarize the dielectric layer of the flash memory. The various processing steps, such as oxide dip, AOD and silicon nitride layer deposition, can be omitted to simplify the fabrication process. The manufacturing cost is thus reduced and is easier to control.

The present invention employs the fixed polishing pad to accomplish the planarization of the dielectric layer of the flash memory device. Since metal ions are absent in the slurry used as the polishing agent in the present invention, the potential problem, for example, the penetration of the metal ions in the KOH slurry into the substrate to damage the device is prevented. The reliability of the device is thereby increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for planarizing a dielectric layer of a flash memory device, comprising:

providing a substrate, wherein the substrate comprises a plurality of gate structures having a protective layer formed thereon and a dielectric layer that fills a space between the gate structures and covers the protective layer; and performing a chemical mechanical polishing process on the dielectric layer, wherein a substrate surface, having the gate structures formed thereon, is pressed against a polishing table that comprises a fixed polishing pad to remove a portion of the dielectric layer, the fixed polishing pad comprising at least a base and a plurality of column shape polishing abrasives bonded onto the base; and a polishing slurry which does not contain metal ions is added to perform the chemical mechanical polishing process.

2. The method of claim 1, wherein the polishing abrasives are bonded onto the base with a resin type of adhesive.

3. The method of claim 1, wherein the slurry includes deionized water.

4. The method of claim 1, wherein the polishing abrasives are column shapes.

5. The method of claim 1, wherein the polishing abrasives are about 40 to 45 microns high.

6. The method of claim 1, wherein the polishing abrasives are about 150 to 250 microns in diameter.

7. The method of claim 1, wherein the dielectric layer is selected from the group consisting of high density plasma oxide, plasma enhanced oxide, TEOS oxide and silicon oxynitride.

8. The method of claim 1, wherein the protective layer includes silicon nitride.

9. A planarizing method for a dielectric layer of a memory device, comprising:

providing a substrate, wherein the substrate comprises a plurality of gate structures;

forming a polishing endpoint layer on the gate structures;

forming a dielectric layer on the substrate; and chemical mechanical polishing the dielectric layer, wherein a substrate surface, having the gate structures formed thereon, is pressed against a polishing table that comprises a fixed polishing pad to remove a portion of the dielectric layer, the fixed polishing pad comprising at least a base and a plurality of column shape polishing abrasives bonded onto the base; and deionized water is added as a polishing slurry.

10. The method of claim 9, wherein the method is applicable for planarizing the dielectric layer of a flash memory device.

11. The method of claim 9, wherein the method is applicable for planarizing the dielectric layer of a mask read-only memory device.

12. The method of claim 9, wherein the method is applicable for planarizing the dielectric layer of an electrically-erasable-programmable-read-only memory device.

13. The method of claim 9, wherein the polishing abrasives are bonded onto the base with a resin adhesive.

14. The method of claim 9, wherein the column shape polishing abrasives are about 40 to 45 micron high.

15. The method of claim 9, wherein the column shape polishing abrasive are about 150 to about 250 micron in diameter.

16. The method of claim 9, wherein the dielectric layer is selected from the group consisting of a high density plasma oxide layer, a plasma enhanced oxide layer, a TEOS oxide layer and a silicon oxynitride layer.

17. The method of claim 9, wherein the polishing endpoint layer includes silicon nitride.

18. The method of claim 10, wherein the polishing endpoint layer includes silicon nitride.

* * * * *